US011937398B2

(12) United States Patent
Liu et al.

(10) Patent No.: US 11,937,398 B2
(45) Date of Patent: Mar. 19, 2024

(54) ONE-WAY AIRFLOW DUAL FAN ASSEMBLY THAT IS OF DISMANTLING EASE

(71) Applicant: Guangtai Electric Machine (Wujiang) Co., Ltd., Suzhou (CN)

(72) Inventors: Jintang Liu, Suzhou (CN); Jiangen Yu, Suzhou (CN); Jinghan Li, Suzhou (CN)

(73) Assignee: GUANGTAI ELECTRIC MACHINE (WUJIANG) CO., LTD., Suzhou (CN)

( * ) Notice: Subject to any disclaimer, the term of this patent is extended or adjusted under 35 U.S.C. 154(b) by 314 days.

(21) Appl. No.: 17/575,721

(22) Filed: Jan. 14, 2022

(65) Prior Publication Data

US 2023/0171918 A1 Jun. 1, 2023

(30) Foreign Application Priority Data

Nov. 26, 2021 (CN) .......................... 202111420070.9

(51) Int. Cl.
*H05K 7/20* (2006.01)
(52) U.S. Cl.
CPC .............................. *H05K 7/20172* (2013.01)
(58) Field of Classification Search
CPC ............ H05K 7/20172; F05D 2260/36; F04D 29/522; F04D 29/646; F04D 19/007; F04D 25/08; F04D 29/541; Y02E 10/72
See application file for complete search history.

(56) References Cited

U.S. PATENT DOCUMENTS

| | | | | |
|---|---|---|---|---|
| 7,442,005 B2 * | 10/2008 | Yeh | ...................... | F04D 29/582 417/423.12 |
| 8,192,157 B2 * | 6/2012 | Horng | ................... | F04D 29/646 415/203 |

* cited by examiner

*Primary Examiner* — Brandon D Lee
(74) *Attorney, Agent, or Firm* — McClure, Qualey & Rodack, LLP

(57) ABSTRACT

A one-way airflow dual fan assembly of dismantling ease, comprising a first installation casing and a second installation casing, the first installation casing is aligned with the second installation casing, a flap is respectively fixed in both the first installation casing and the second installation casing, a cover plate is provided in the flap, connection mechanisms are provided between the cover plate and the flap, the flap is connected with the cover plate via the plurality of connection mechanisms, and the connection mechanisms comprise respectively a flexible connection component and a limiting part. By cooperation of the cover plates and the connection mechanisms, by pulling the cover plates, under limiting actions of the second wedges, the first wedges are pressed, the U-shaped connection blocks deform flexibly until the flexible connection components are released, and the cover plates are released from the flaps, so that the cover plates can be disassembled.

7 Claims, 6 Drawing Sheets

ONE-WAY AIRFLOW DUAL FAN ASSEMBLY THAT IS OF DISMANTLING EASE

TECHNICAL FIELD

The present invention relates the technical field of fans, especially a one-way airflow dual fan assembly that is of dismantling ease.

BACKGROUND TECHNOLOGY

When it is necessary to cool one or more parts, and rotation of only one fan cannot satisfy demands of heat dissipation, usually two fans are mounted on a frame to run simultaneously and dissipate heat, and both fans are respectively protected with a cover plate, however, in the prior art, the cover plate is fixed by bolts, and the bolt tightening process is quite complicated, which makes it not convenient to dismantle and install the same.

SUMMARY OF INVENTION

The present invention aims to provide a one-way airflow dual fan assembly that is of dismantling ease, to solve the problems explained in the background technology.

To realize the foregoing aim, the present invention provides the following technical solution: a one-way airflow dual fan assembly that is of dismantling ease, comprising a first installation casing and a second installation casing, wherein the first installation casing is structurally aligned with the second installation casing, a flap is respectively fixed and installed in both the first installation casing and the second installation casing, a cover plate is provided in the flap, a plurality of connection mechanisms are provided between the cover plate and the flap and the flap is connected with the cover plate via the plurality of connection mechanisms;

wherein the plurality of connection mechanisms comprise respectively a flexible connection component and a limiting part, the flexible connection component is connected with the cover plate, the limiting part is connected with the flap, and the flexible connection component and the limiting part are flexibly joined together.

Preferably, the flexible connection component comprises a U-shaped connection block and a first wedge, wherein the first wedge is connected at a bottom portion of the U-shaped connection block, a deformable slot is provided at an intermediate portion of the U-shaped connection block, and a top portion of the U-shaped connection block is connected with the cover plate.

Preferably, the limiting part comprises fixing blocks and a second wedge, wherein the fixing blocks are provided at both sides of the flexible connection component, the fixing blocks are connected with the flap, and the second wedge is connected to a bottom portion of one of the fixing blocks.

Preferably, the first installation casing comprises a first connection seat, a connection jacket and a plurality of installation sleeves, wherein the first connection seat is connected at a bottom side of the connection jacket and the plurality of installation sleeves are connected to corners of the first connection seat.

Preferably, the second installation casing comprises a second connection seat, a plurality of connection pillars and a plurality of pins, wherein the plurality of connection pillars are connected to corners of the second connection seat and the plurality of pins are connected respectively to bottom portions of the plurality of connection pillars.

Preferably, the plurality of pins and top portions of the plurality of installation sleeves make cup joint fitting.

Preferably, two fan bodies are provided inside the connection jacket, and the two fan bodies are respectively mounted on two flaps.

Technical effects and advantages of the present invention are:

(1) In the present invention, by cooperation of the cover plates and the plurality of connection mechanisms, by pulling the cover plates outwards, under limiting actions of the second wedges, the first wedges are pressed so that the bottom portions of the U-shaped connection blocks deform flexibly inwards until the flexible connection components are released from the limiting parts, and at this time, the cover plates are released from the flaps, so that the cover plates can be disassembled, and it is more convenient to repair the fan bodies;

(2) In the present invention, by engagement of the plurality of installation sleeves and the plurality of connection pillars, a relative position between the first installation casing and the second installation casing can be supported, so that an engagement position between the first installation casing and the second installation casing is more accurate and more stable.

Figure 1:
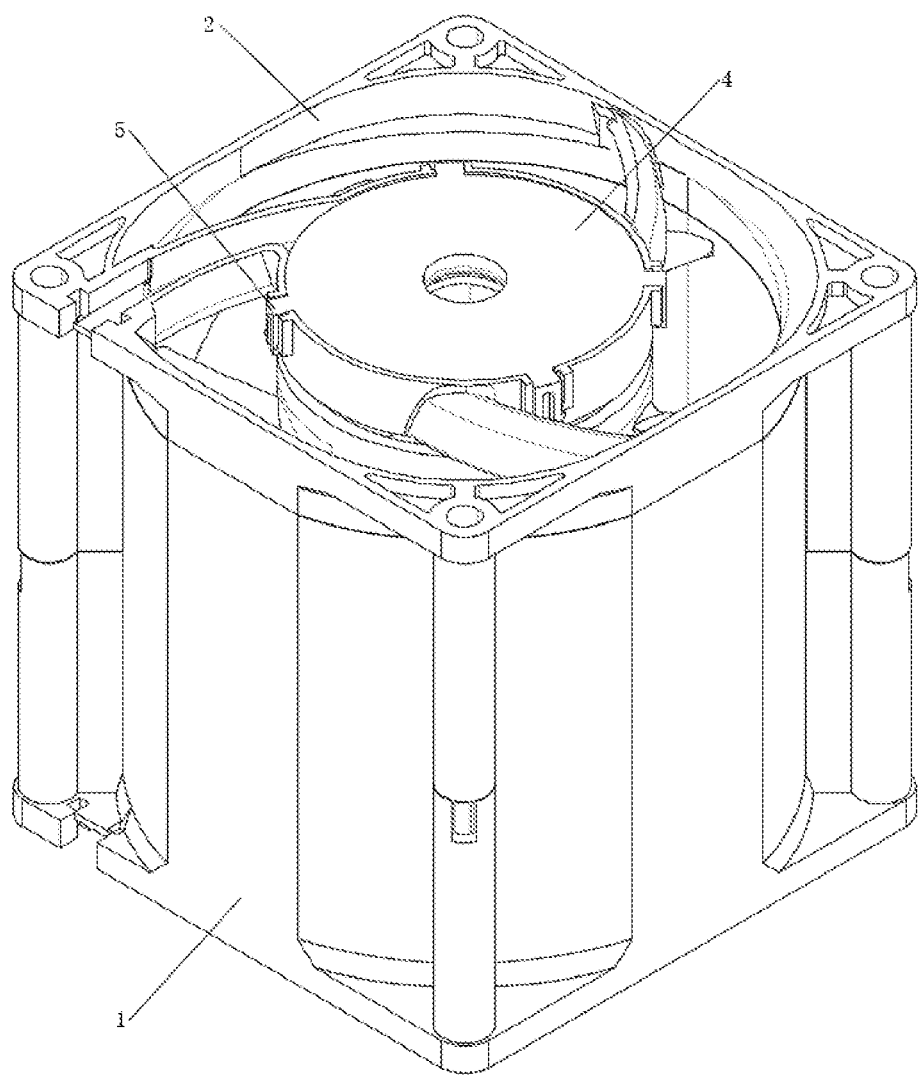
FIG. 1 is an overall structural diagram showing the present invention.

In the drawings: 1. first installation casing; 11. first connection seat; 12. connection jacket; 13. installation sleeve; 2. second installation casing; 21. second connection seat; 22. connection pillar; 23. pin; 3. flap; 4. cover plate; 5. connection mechanism; 51. flexible connection component; 511. U-shaped connection block; 512. first wedge; 52. limiting part; 521. fixing block; 522. second wedge; and 6. fan body.

EMBODIMENTS

The technical solutions in the embodiments of the present invention will be clearly and completely described below with reference to the accompanying drawings in the embodiments of the present invention. Obviously, the described embodiments are only some of the embodiments of the present invention, but not all of the embodiments. Based on the embodiments of the present invention, all other embodiments obtained by those of ordinary skill in the art without creative efforts shall fall within the protection scope of the present invention.

Figure 2:
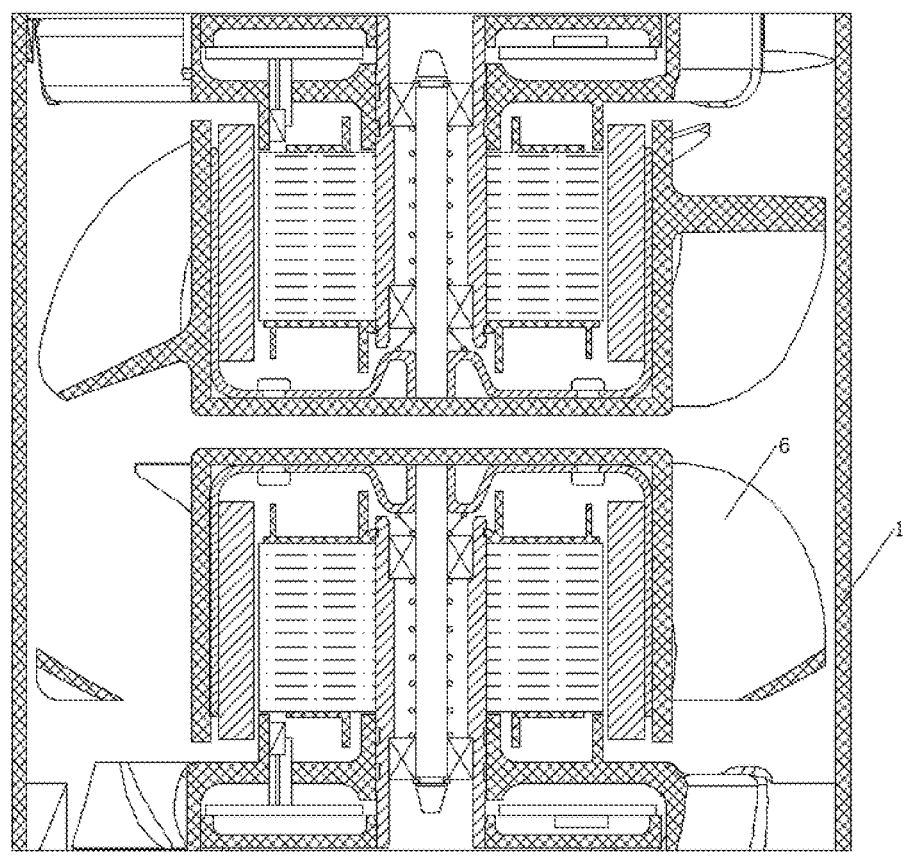
FIG. 2 is a structural diagram showing inner structures of the fan assembly according to the present invention.
Figure 3:
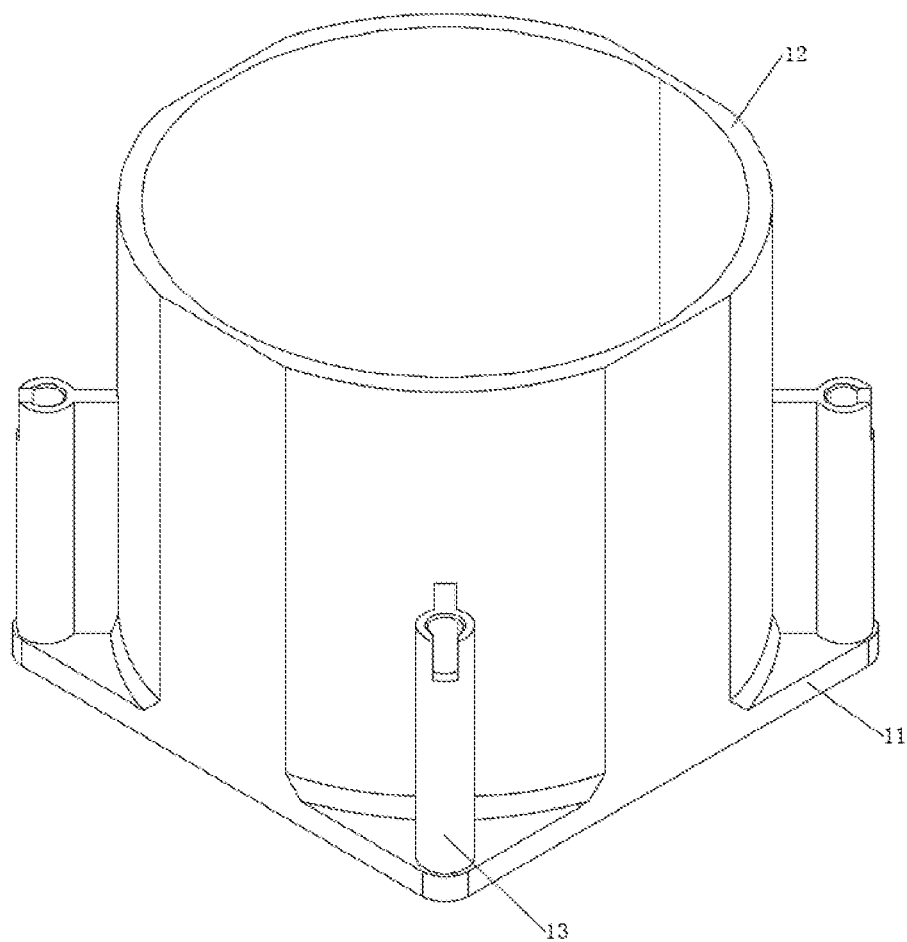
FIG. 3 is a structural diagram showing the first installation casing of the present invention.
Figure 4:
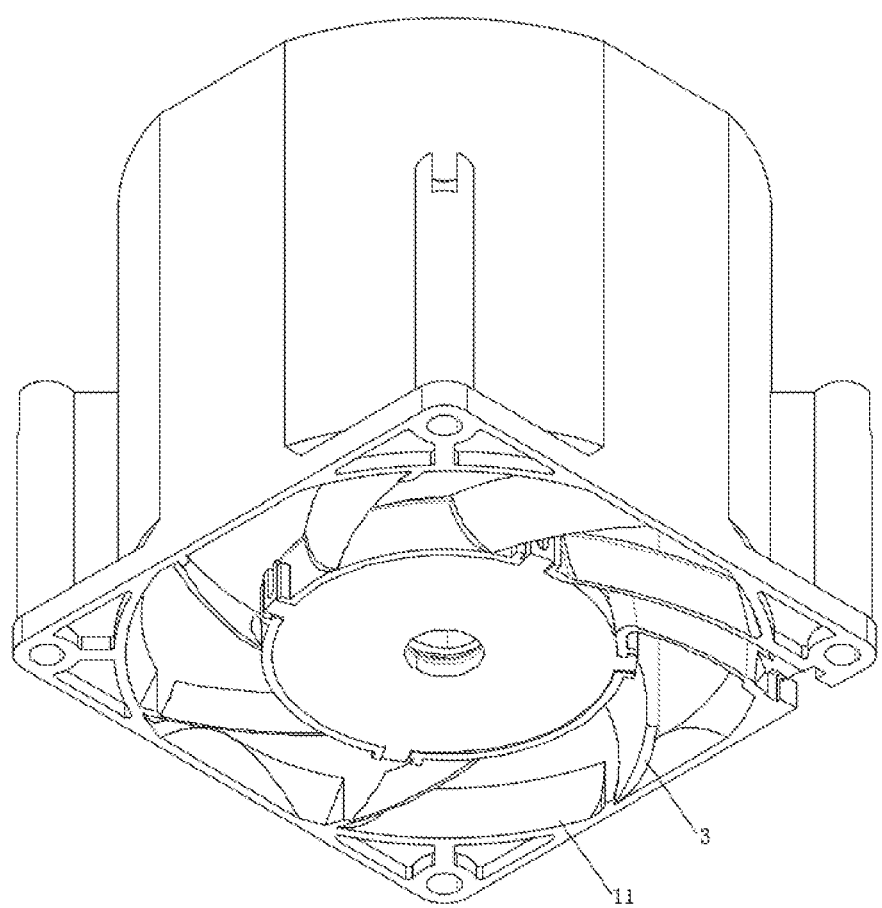
FIG. 4 is another structural diagram showing the first installation casing according to the present invention.
Figure 5:
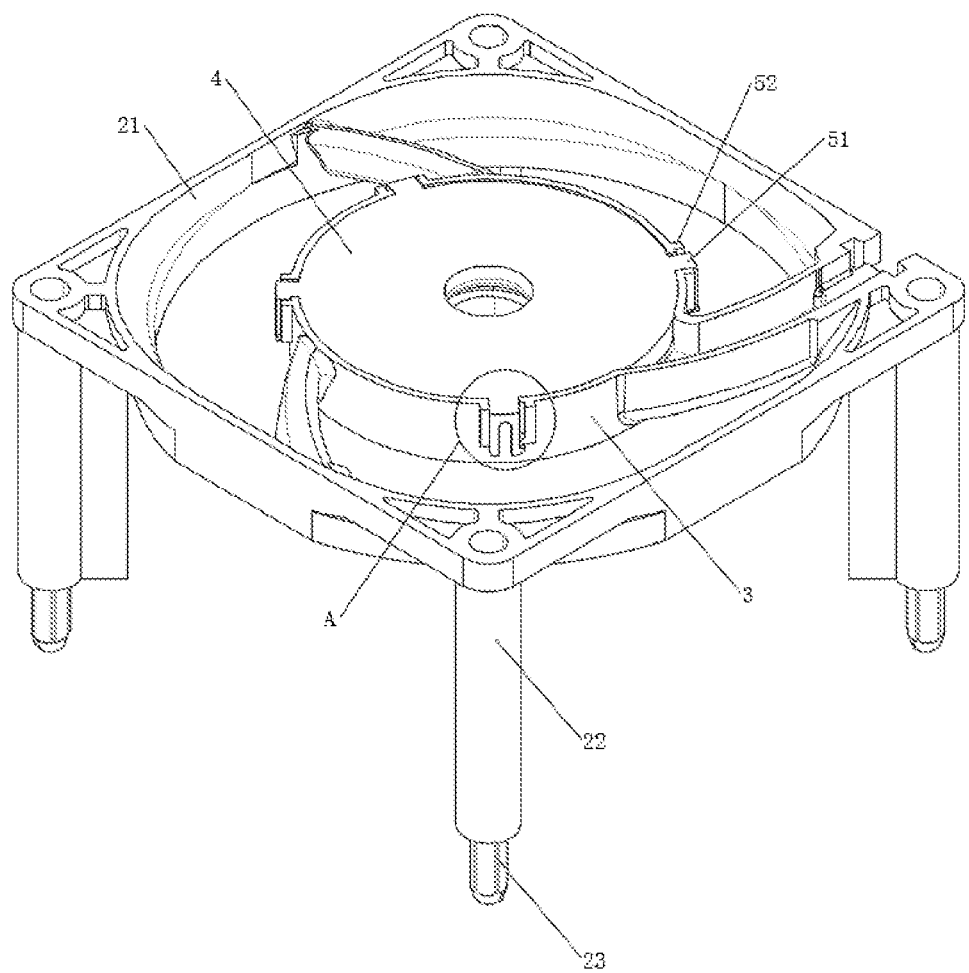
FIG. 5 is a structural diagram showing the second installation casing according to the present invention.
Figure 6:
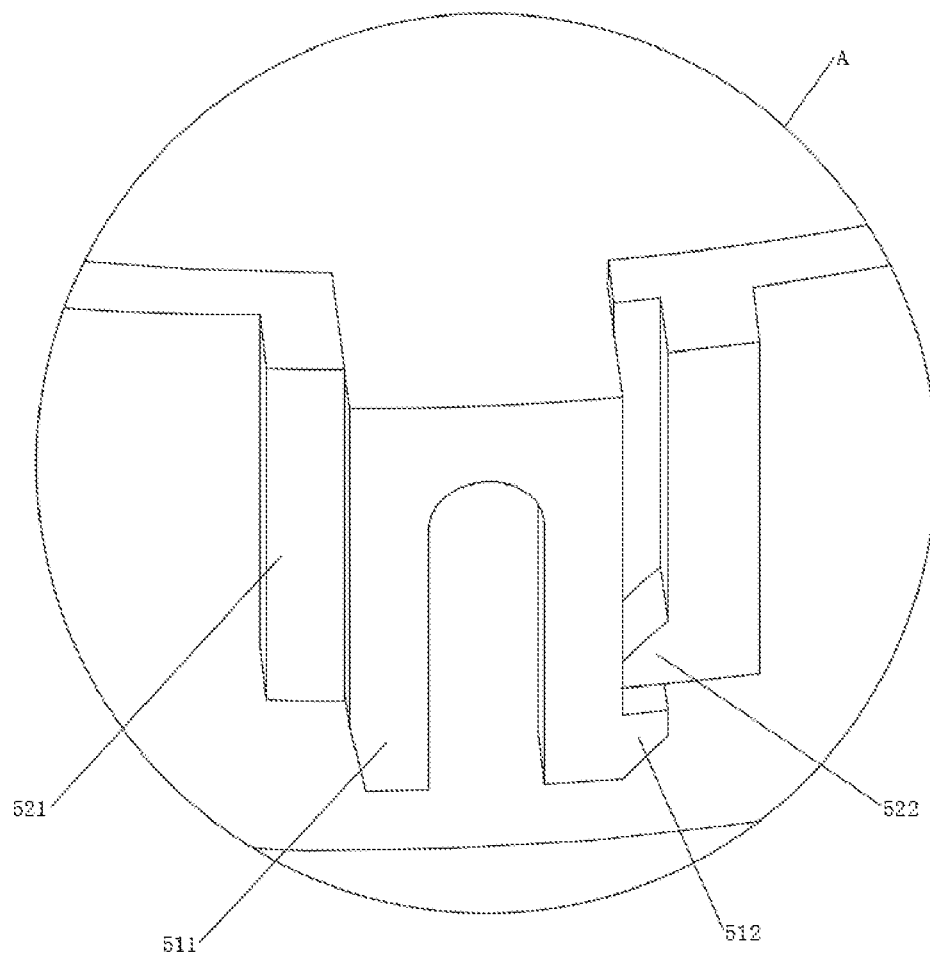
FIG. 6 is a structural enlarged diagram of a part labeled "A" in FIG. 5 of the present invention.

As shown in FIG. 1 to FIG. 6, the present invention provides a one-way airflow dual fan assembly that is of dismantling ease, comprising a first installation casing 1 and a second installation casing 2, wherein the first installation casing 1 is aligned with the second installation casing 2, a flap 3 is respectively provided in the first installation casing 1 and the second installation casing 2, and by cooperation of the first installation casing 1 and the second installation casing 2, the outgoing airflow is more smooth, and as the air outlets are well-aligned, noise is less, so vibration is reduced and stability of the fan assembly is improved; by providing the flaps 3 at an end of the first installation casing 1 and an end of the second installation casing 2, dismantling and maintenance of the fan assembly is convenient, wherein one of the flaps 3 is connected in a first connection seat 11, and another of the flaps 3 is connected in a second connection seat 21, so that fan bodies 6 can be installed on the flaps 3, cover plates 4 are fitted in the flaps 3, so the fan bodies 6 can be protected by the cover plates 4, and after removing the cover plates 4, it is possible to repair the fan bodies 6 installed on the flaps 3; a plurality of connection mechanisms 5 are installed between the cover plates 4 and the flaps 3, the flaps 3 are connected to the cover plates 4 via the plurality of connection mechanisms 5, so that installation of the flaps 3 and the cover plates 4 can be more convenient.

The plurality of connection mechanisms 5 comprise respectively a flexible connection component 51 and a limiting part 52, wherein the flexible connection component 51 is connected with the cover plate 4, the limiting part 52 is connected with the flap 3, and the flexible connection component 51 is flexibly connected with the limiting part 52, wherein the flexible connection component 51 comprises a U-shaped connection block 511 and a first wedge 512, the first wedge 512 is connected to a bottom portion of the U-shaped connection block 511, a deformable slot is provided in an intermediate portion of the U-shaped connection block 511, and by the deformable slot, deformation of the U-shaped connection block 511 is possible, so that the U-shaped connection block 511 can have flexible bending and deformation; a top portion of the U-shaped connection block 511 is connected with the cover plate 4, the limiting part 52 comprises fixing blocks 521 and a second wedge 522, wherein the fixing blocks 521 are provided on both sides of the flexible connection component 51, the fixing blocks 521 are connected with the flap 3, the second wedge 522 is connected to a bottom portion of one of the fixing blocks 521, the fixing block 521 are provided on both sides of the U-shaped connection block 511, so it is convenient to limit positions of both sides of the U-shaped connection block 511, and the U-shaped connection block 511 can make vertical movement only, when the flexible connection component 51 is fitted together with the limiting part 52, a contact surface between the first wedge 512 and the second wedge 522 is planar, and by contact and engagement of the surfaces, relative positions between the flexible connection component 51 and the limiting part 52 can be limited, so as to prevent the flexible connection component 51 to move vertically, limit the flexible connection component 51 in both horizontal and vertical direction, and the cover plate 4 stays stable in the flap 3 after fitting of the flexible connection component 51 and the limiting part 52.

The first installation casing 1 comprises a first connection seat 11, a connection jacket 12 and a plurality of installation sleeves 13, wherein the first connection seat 11 is connected to a bottom portion of the connection jacket 12, and the plurality of installation sleeves 13 are fixed and connected to corners of the first connection seat 11; the second installation casing 2 comprises a second connection seat 21, a plurality of connection pillars 22 and a plurality of pins 23, wherein the plurality of connection pillars 22 are connected to corners of the second connection seat 21, the plurality of pins 23 are connected to bottom portions of the plurality of connection pillars 22, and the plurality of pins 23 and the plurality of installation sleeves 13 make cup joint fittings; two fan bodies 6 are provided in the connection jacket 12, wherein the two fan bodies 6 are respectively connected on the flaps 3; by cooperation of the plurality of installation sleeves 13 and the plurality of connection pillars 22, relative positions between the first installation casing 1 and the second installation casing 2 can be supported so that engagement between the first installation casing 1 and the second installation casing 2 is more accurate and stable; by joining of the plurality of pins 23 and the plurality of installation sleeves 13, installation positions of the first installation casing 1 and the second installation casing 2 can be limited, misalignment during installation of the first installation casing 1 and the second installation casing 2 can be prevented, and installation of the first installation casing 1 and the second installation casing 2 can be precise.

Working principles of the present invention:

During use, first of all, install the fan bodies 6 on the flaps 3, orient the plurality of pins 23 on the plurality of connection pillars 22 to inner cavities of the plurality of installation sleeves 13, plug the plurality of pins 23 into the inner cavities of the installation sleeves 13, so that the fan bodies 6 connected on the flaps 3 can be installed inside the connection jacket 12, thereafter, fix the flexible connection components 51 into the corresponding limiting parts 52, press the cover plates 4, so that the flexible connection components 51 are deformed and fitted inside the limiting parts 52, and installation of the cover plates 4 and the flaps 3 can be done, when it is necessary to disassemble one or more of the cover plates 4 and repair one or more of the fan bodies 6 installed on the flaps 3, it is only necessary to pull the cover plates 4 outwards, so that the bottom portions of the U-shaped connection blocks 511 will deform flexibly inwards, until the flexible connection components 51 are released from the limiting parts 52, and at this time, the cover plates 4 are released from the flaps 3, so that disassembly of the cover plates 4 can be done.

Finally it shall be noted that: the foregoing are only some preferred embodiments of the present invention, and are not intended to limit the present invention, although the present invention has been described in detail with reference to the foregoing embodiment, for those skilled in the art, it is still possible to modify the technical solutions recorded in the foregoing embodiments, or to replace some of the technical features with equivalents thereof, and all modifications, equivalent replacements and improvements made within spirits and principles of the present invention shall be covered in the protection scope of the present invention.

The invention claimed is:

1. A one-way airflow dual fan assembly that is of dismantling ease, comprising a first installation casing and a second installation casing, wherein the first installation casing is structurally aligned with the second installation casing, a flap is respectively fixed and installed in both the first installation casing and the second installation casing, a cover plate is provided in the flap, a plurality of connection mechanisms are provided between the cover plate and the flap and the flap is connected with the cover plate via the plurality of connection mechanisms;

wherein the plurality of connection mechanisms comprise respectively a flexible connection component and a limiting part, the flexible connection component is connected with the cover plate, the limiting part is connected with the flap, and the flexible connection component and the limiting part are flexibly joined together.

2. The one-way airflow dual fan assembly that is of dismantling ease according to claim 1, wherein the flexible connection component comprises a U-shaped connection block and a first wedge, wherein the first wedge is connected at a bottom portion of the U-shaped connection block, a deformable slot is provided at an intermediate portion of the U-shaped connection block, and a top portion of the U-shaped connection block is connected with the cover plate.

3. The one-way airflow dual fan assembly that is of dismantling ease according to claim 1, wherein the limiting part comprises fixing blocks and a second wedge, wherein the fixing blocks are provided at both sides of the flexible connection component, the fixing blocks are connected with the flap, and the second wedge is connected to a bottom portion of one of the fixing blocks.

4. The one-way airflow dual fan assembly that is of dismantling ease according to claim 1, wherein the first installation casing comprises a first connection seat, a connection jacket and a plurality of installation sleeves, wherein the first connection seat is connected at a bottom side of the connection jacket and the plurality of installation sleeves are connected to corners of the first connection seat.

5. The one-way airflow dual fan assembly that is of dismantling ease according to claim 1, wherein the second installation casing comprises a second connection seat, a plurality of connection pillars and a plurality of pins, wherein the plurality of connection pillars are connected to corners of the second connection seat and the plurality of pins are connected respectively to bottom portions of the plurality of connection pillars.

6. The one-way airflow dual fan assembly that is of dismantling ease according to claim 5, wherein the plurality of pins and top portions of the plurality of installation sleeves make cup joint fitting.

7. The one-way airflow dual fan assembly that is of dismantling ease according to claim 4, wherein two fan bodies are provided inside the connection jacket, and the two fan bodies are respectively mounted on two flaps.

* * * * *